United States Patent
Cok et al.

(10) Patent No.: US 6,885,157 B1
(45) Date of Patent: Apr. 26, 2005

(54) INTEGRATED TOUCH SCREEN AND OLED FLAT-PANEL DISPLAY

(75) Inventors: Ronald S. Cok, Rochester, NY (US); Jeffrey P. Serbicki, Holley, NY (US); Joseph E. Yokajty, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/721,129

(22) Filed: Nov. 25, 2003

(51) Int. Cl.[7] .............................. G09G 3/10; G09G 3/24
(52) U.S. Cl. .............................. 315/169.3; 315/169.2; 345/173; 345/76
(58) Field of Search .................. 315/169.3, 169.2; 313/501; 345/55, 76, 80, 206, 173, 174; 340/825; G09G 3/10, 3/24

(56) References Cited

U.S. PATENT DOCUMENTS

| | | | |
|---|---|---|---|
| 4,769,292 A | 9/1988 | Tang et al. .................. 428/690 |
| 4,893,115 A | 1/1990 | Blanchard ................... 340/172 |
| 5,061,569 A | 10/1991 | VanSlyke et al. ........... 428/457 |
| 6,035,180 A | 3/2000 | Kubes et al. ................. 455/90 |
| 6,177,918 B1 | 1/2001 | Colgan et al. ................. 345/87 |
| 6,395,863 B2 | 5/2002 | Geaghan ..................... 528/196 |
| 6,424,094 B1 | 7/2002 | Feldman .................. 315/169.3 |
| 6,483,498 B1 | 11/2002 | Colgan et al. ............. 345/173 |
| 6,504,530 B1 | 1/2003 | Wilson et al. ............. 345/173 |
| 6,623,608 B2 | 9/2003 | Cropper et al. ......... 204/192.22 |
| 6,814,642 B2 * | 11/2004 | Kilmer et al. ................ 445/24 |
| 2002/0167270 A1 | 11/2002 | Siwinski et al. ............ 313/506 |
| 2002/0171610 A1 | 11/2002 | Siwinski et al. ............. 345/76 |
| 2002/0186208 A1 | 12/2002 | Feldman et al. ............ 345/173 |
| 2003/0150107 A1 | 8/2003 | Cropper et al. .............. 29/832 |
| 2004/0080267 A1 * | 4/2004 | Cok ........................... 313/512 |
| 2004/0090426 A1 * | 5/2004 | Bourdelais et al. ......... 345/173 |
| 2004/0212603 A1 * | 10/2004 | Cok ........................... 345/175 |

\* cited by examiner

*Primary Examiner*—Trinh Vo Dinh
(74) *Attorney, Agent, or Firm*—Andrew J. Anderson

(57) ABSTRACT

An integrated touch screen and OLED flat-panel display includes a touch screen having a touch screen substrate with electrical contacts for receiving touch screen signals and conductive vias through the substrate and electrically connected to the electrical contacts; an OLED flat-panel display having a display substrate with electrical contacts for receiving display signals and an exposed area on the display substrate for providing electrical connection to the electrical contacts of the display and the touch screen; and wherein the touch screen substrate is the cover or substrate of the OLED flat-panel display, the conductive vias are electrically connected to conductors and electrical contacts located on the display substrate, and the substrate of the OLED flat-panel display protrudes beyond the cover to provide electrical connection to the electrical contacts of the display and touch screen.

5 Claims, 3 Drawing Sheets

INTEGRATED TOUCH SCREEN AND OLED FLAT-PANEL DISPLAY

FIELD OF THE INVENTION

The present invention relates to touch screens for use with organic light emitting diode displays and, more particularly, to an integrated touch screen and OLED flat-panel display.

BACKGROUND OF THE INVENTION

Emissive flat-panel display devices are widely used in conjunction with computing devices and in particular with portable devices. These displays are often used in portable devices or in public areas where the use of a keyboard in association with the computer used to drive the display is impractical. In these situations, a touch screen interface to the display is often employed.

A touch screen is a device placed over or above a display which provides a signal when the screen is mechanically touched. There are a variety of detection methods used including capacitive, surface acoustic wave, infrared, and resistive (with either four or five wires). With the exception of the infrared method, each of these methods relies on a hard substrate into on onto which various signals and detecting devices are built. Resistive touch screens have a conductive coating deposited upon the substrate and a conductive, flexible cover sheet placed over the substrate that is indented by a stylus or finger to create an electrical connection between the conductive flexible cover and the conductive substrate. The flexible cover sheet extends over the substrate except for a portion where electrical connections are made to the substrate. Electrical connections to touch screens are typically made by soldering a cable having a plurality of wires to the conductive face of the substrate in this exposed area. U.S. Pat. No. 4,893,115 titled "Touch Sensitive Visual Display System" issued Jan. 9, 1990, describes a resistive wire touch screen known in the art.

Flat-panel display devices such as OLEDs and LCDs utilize a similar approach in providing electrical connections to the display. These display devices have conductors and electrical components integrated onto a substrate and electrically connected via a cable at an exposed location on the substrate.

It is known to use the substrate of a resistive touch screen as the substrate of an LCD display. U.S. Pat. No. 6,483,498 titled "Liquid Crystal Display With Integrated Resistive Touch Sensor" granted to Colgan et al and issued Nov. 19, 2002 describes a liquid crystal display that includes a first substrate having a first conductive layer formed thereon. A linearization pattern is formed on the first conductive layer for applying voltage gradients across the first conductive layer. A flexible polarizer is included having a second conductive layer formed thereon facing the first conductive layer across a gap formed therebetween, the polarizer providing a contact surface such that a touched position on the polarizer causes contact between the first conductive layer and the second conductive layer thereby identifying a location of the touched position. However, this arrangement requires cable connections on two substrates and in different areas, thereby increasing the difficulty and decreasing the robustness of cable connections.

US Published Patent Application No. 2002/0186208 titled "Organic Electroluminescent Display With Integrated Touch Screen" published Dec. 12, 2002 discloses an electroluminescent display with integrated touch screen, including: a transparent substrate having two faces; a flat panel display matrix forming an electroluminescent display located on one face of the substrate for emitting light through the substrate; touch sensitive elements of a touch screen located on the other face of the substrate; and a single flex-cable containing a plurality of conductors electrically connected to both the flat panel display matrix and the touch sensitive elements for providing external electrical connection to the display. However, this arrangement also requires cable connections on two substrates and in different areas, thereby increasing the difficulty and decreasing the robustness of cable connections.

As noted, these arrangements do not optimize the space needed to provide connections to both the touch screen and the flat-panel display. It is also important to minimize the size of peripheral borders for both touch and display screens. Moreover, signals for both the display and touch screens must be processed before use and the configurations in the prior art do not provide the capability for integrating the cabling and associated processing.

There is a need therefore for an improved integrated touch screen nd OLED flat panel display.

SUMMARY OF THE INVENTION

The need is met according to the present invention by providing an integrated touch screen and OLED flat-panel display that includes a) a touch screen having a touch screen substrate with electrical contacts for receiving touch screen signals and conductive vias through the substrate and electrically connected to the electrical contacts; and b) an OLED flat-panel display having a display cover and a display substrate with electrical contacts for receiving display signals and an exposed area on the display substrate for providing electrical connection to the electrical contacts of the display and the touch screen; wherein the touch screen substrate forms the cover or substrate of the OLED flat-panel display, the conductive vias are electrically connected to conductors and electrical contacts located on the display substrate, and the substrate of the OLED flat-panel display protrudes beyond the display cover to provide electrical connection to the electrical contacts of the display and touch screen.

ADVANTAGES

The present invention has the advantage that it reduces the costs and improves the reliability and performance of a touch screen that is used with an OLED flat-panel display by integrating cable connections on a single substrate and providing touch screen signal processing on the display substrate.

DETAILED DESCRIPTION OF THE INVENTION

Figure 1:
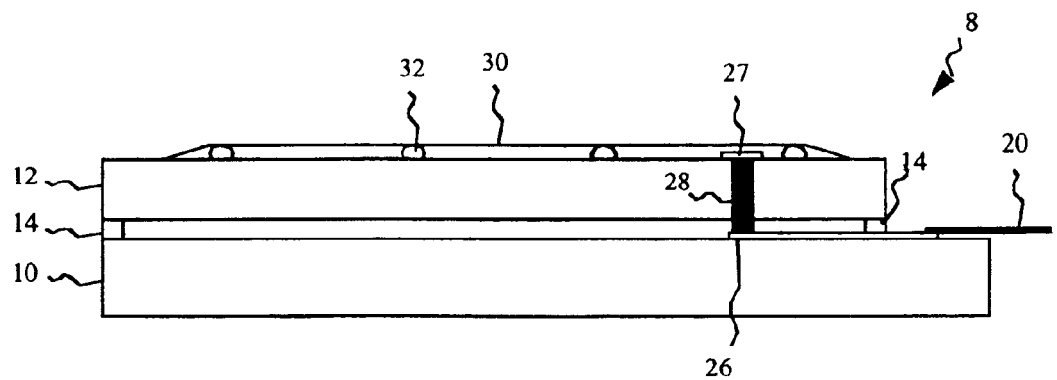
FIG. 1 is a schematic side view of one embodiment of the integrated flat-panel display and touch screen of the present invention.

According to the present invention, an integrated resistive touch screen and flat-panel top-emitting OLED display 8 overcomes the problem of multiple external electrical connections by employing a flat-panel display having a substrate that extends beyond the substrate of the resistive touch screen. Referring to FIG. 1, a display substrate 10 is affixed using an adhesive 14 to a cover 12 that is also the substrate of a resistive touch screen. Any space between the substrate 10 and cover 12 may be left empty or filled with any one or more of a variety of materials to improve the sealing and robustness of the display, for example, desiccants, liquids such as oils, polymers, pressure sensitive adhesives, and adhesives such as epoxies. The substrate 10 protrudes beyond the cover 12 to expose electrical connections 26 formed on the substrate 10 and to which are connected a cable 20. The electrical connections 26 electrically connect display elements of the display 8 to the cable 20. The resistive touch screen includes a flexible top sheet 30 and spacer dots 32 separating to cover 12 and the flexible top sheet 30. Other touch screens having a substrate may also be used, for example resistive, capacitive, inductive, optical or surface acoustic touch screens. These touch screens are well known in the art.

Electrical connections 27 are also formed on the cover 12 and can be located either underneath (as shown) or outside the flexible top sheet 30. Placing the connections 27 under the flexible top sheet 30 may save space on the periphery of the touch screen, thereby increasing the relative active area of the touch screen. This is an important issue, since, in general, the inactive periphery of a touch screen is greater than that of a flat-panel display. Electrically conductive vias 28 connect the touch screen connections 27 through the cover 12 to the substrate 10 of the display 8 and connect to the electrical connections 26. Thus, the touch screen electrical connections 27 are provided on the substrate 10 and may be connected at a single location to the single cable 20.

Figure 5:
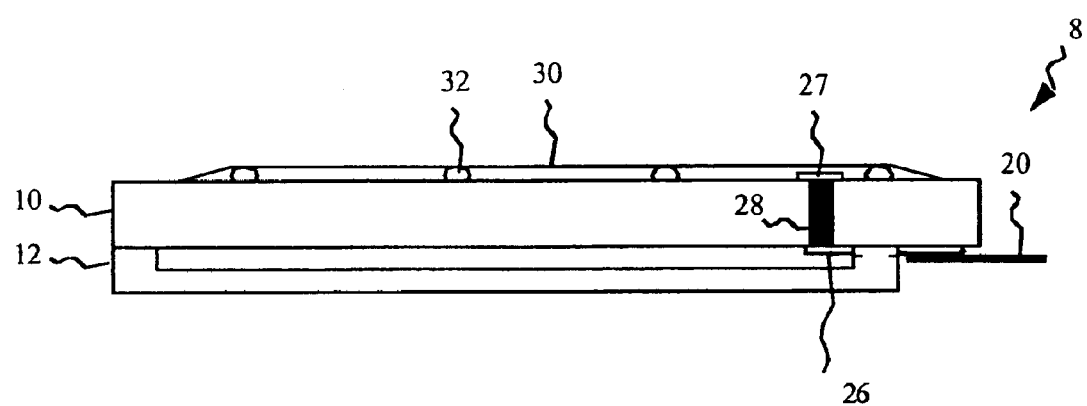
FIG. 5 is a schematic side view of an alternative embodiment of the integrated flat-panel display and touch screen of the present invention.

In an alternative embodiment, the touch screen is not the cover but the substrate of the integrated resistive touch screen and flat-panel top-emitting OLED display 8. Referring to FIG. 5, the substrate 10 of the display is also the substrate of the touch screen. The electrical connections 26 and 27, vias 28, and cable 20 are all connected as described above.

The substrate 10 or cover 12 are typically coated with ITO or another suitable conductor for providing conductivity for the touch screen or display. After the initial coating is applied and any desired additional processing, holes are formed by drilling or etching into the substrate 10 or cover 12. The holes are then coated or filled with conductive material, such as a metal or metal composite like solder, to form conductive vias 28. In the case where the vias 28 are formed in the cover 12, an additional ball of conductive material having a low-temperature melting point, such as solder, is located on the via 28 so as to contact the substrate 10. After the substrate 10 and cover 12 are placed in contact and adhered (usually around the perimeter), the assembly may be heated to melt the solder and form an electrical connection between the via 28 and connections 26. Since the distance between the cover 12 and the substrate 10 is typically very small, for example 10–50 microns, an electrical contact may be established and maintained. Alternatively, the contact material may not be heated and may simply form a mechanical contact in slight compression.

Figure 2:
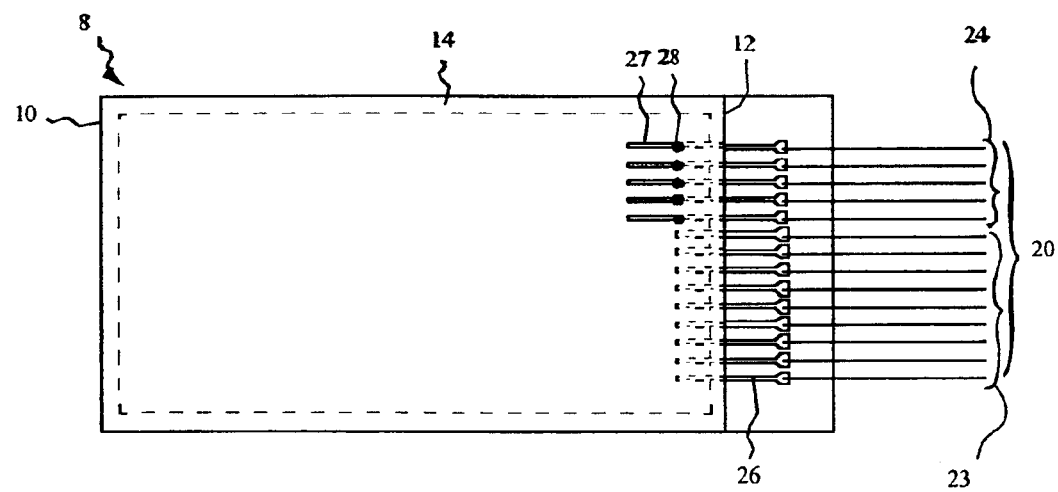
FIG. 2 is a schematic top view of the embodiment shown in FIG. 1.
Figure 3:
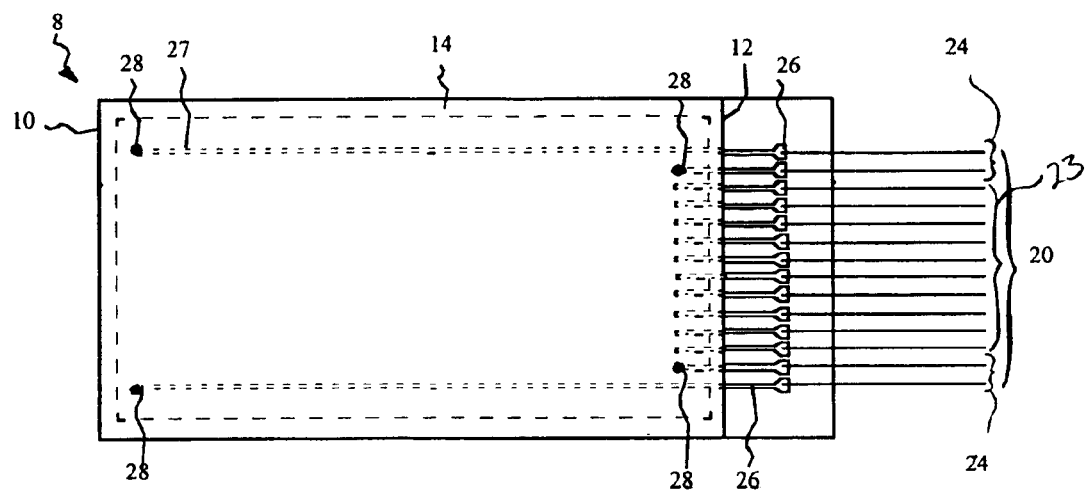
FIG. 3 is a schematic top view of an alternative arrangement of electrical connections according to the present invention.

Referring to FIG. 2, a top view of the arrangement of FIG. 1 is shown. In FIG. 2, a plurality of touch screen electrical connections 27 on the cover 12 are shown. The touch screen electrical connections 27 are electrically connected through vias 28 to the plurality of electrical connections 26 connected to an electrical cable 20 on the substrate 10. The electrical connections 26 include connections 23 for light emitting components on the substrate 10 and the connections 24 for the touch screen. A wide variety of physical arrangements are possible. The connections 23 and 24 may be interdigitated within the cable 20, for example. The electrical connections 27 on the cover may be made through the vias 28 located in a wide variety of positions on the cover 12. As shown in FIG. 3, the vias 28 are placed near the corners of the active areas of the touch screen. Moreover, the cable 20 may comprise one or more separate cables.

Figure 4:
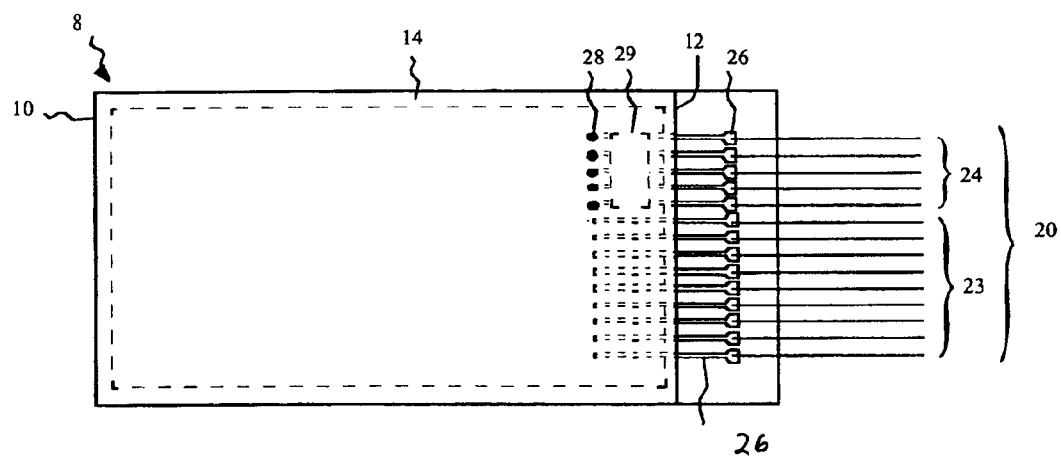
FIG. 4 is a schematic top view of an alternative arrangement of electrical connections according to the present invention.

Signals from electrical connections 27 of the touch screen through the vias 28 may be processed on the substrate 10. In typical flat-panel, active-matrix displays, processing circuitry is provided to drive the individual light emitting elements of the display. Circuitry using similar components, for example resistors, transistors, and capacitors may be used to build up complex signal processing circuits that may be employed to process the touch screen signals. The circuits may be electrically connected to the touch screen electrical connections 27 and produce output signals provided on the electrical connections 26 and then connected to the cable elements 24 and the cable 20. Referring to FIG. 4, a circuit 29 is electrically connected to the touch screen electrical connections 27 through vias 28 and produce output signals electrically connected to the cable elements 24 and the cable 20.

The present invention can be employed in most top- or bottom-emitting OLED device configurations. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 8 integrated OLED display and touch screen
10 substrate
12 cover
14 adhesive
20 electrical cable
23 electrical cable
24 electrical cable
26 electrical connector 27 electrical connector
28 conductive via
29 circuits
30 flexible top protective layer
32 spacer dot What is clamed is:

1. An integrated touch screen and OLED flat-panel display, comprising:

a) a touch screen having a touch screen substrate with electrical contacts for receiving touch screen signals and conductive vias through the substrate and electrically connected to the electrical contacts; and b) an OLED flat-panel display having a display cover and a display substrate with electrical contacts located on the display substrate for receiving display signals and an exposed area on the display substrate for providing electrical connection to the electrical contacts of the display substrate and the electrical contacts of the touch screen substrate;

wherein the touch screen substrate forms the cover or substrate of the OLED flat-panel display, the conductive vias are electrically connected to the electrical contacts of the display substrate, and the substrate of the OLED flat-panel display protrudes beyond the display cover to provide electrical connection to the electrical contacts of the display and touch screen.

2. The integrated touch screen and OLED flat-panel display claimed in claim 1, further comprising processing circuitry located on the display substrate for processing the touch screen signals.

3. The integrated touch screen and OLED flat-panel display claimed in claim 1, further comprising a single electrical cable connected to the display substrate and connected to the electrical contacts of the display substrate and to the electrical contacts of the touch screen substrate.

4. The integrated touch screen and OLED flat-panel display claimed in claim 1, wherein the substrate of the OLED display is the substrate of the touch screen and the OLED flat-panel display is a bottom-emitting display.

5. The integrated touch screen and OLED flat-panel display claimed in claim 1, wherein the cover of the OLED display is the substrate of the touch screen and the OLED flat-panel display is a top-emitting display.

* * * * *